United States Patent
Kao

(10) Patent No.: US 8,729,907 B2
(45) Date of Patent: May 20, 2014

(54) RESISTANCE-CAPACITANCE CALIBRATION CIRCUIT WITHOUT CURRENT MISMATCH AND METHOD THEREOF

(75) Inventor: Shiau-Wen Kao, Hsinchu (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 226 days.

(21) Appl. No.: 13/439,877

(22) Filed: Apr. 5, 2012

(65) Prior Publication Data

US 2013/0207693 A1    Aug. 15, 2013

(30) Foreign Application Priority Data

Feb. 13, 2012    (TW) ............................. 101104510 A

(51) Int. Cl.
*G01R 35/00*    (2006.01)
(52) U.S. Cl.
USPC .............. 324/601; 324/612; 324/600; 257/48
(58) Field of Classification Search
USPC ................. 324/600–612, 500, 691, 707–711, 324/750.3, 679; 257/48; 438/14–18
See application file for complete search history.

(56) References Cited

U.S. PATENT DOCUMENTS

| | | | |
|---|---|---|---|
| 5,387,882 A * | 2/1995 | Schoofs | 331/111 |
| 6,262,603 B1 | 7/2001 | Mohan | |
| 8,041,294 B2 | 10/2011 | Rofougaran | |
| 8,174,283 B2 * | 5/2012 | Bhalla et al. | 324/762.09 |

* cited by examiner

*Primary Examiner* — Melissa Koval
*Assistant Examiner* — Trung Nguyen
(74) *Attorney, Agent, or Firm* — Winston Hsu; Scott Margo

(57) ABSTRACT

A resistor-capacitor (RC) calibration circuit includes: a current source, providing a current to a first node; a first switch, coupled between the first node and a second node; a second switch, coupled between the first node and a third node; a resistor, coupled between a reference terminal and the second node; a variable capacitor, coupled between the reference terminal and the third node; a third switch, coupled between the third node and the reference terminal; a comparator, comprising a first input coupled to the second node and a second input coupled to the third node; and a logic controller, coupled between an output of the comparator and the variable capacitor for outputting an adjusting signal according to an output signal of the comparator to adjust a capacitance of the variable capacitor.

25 Claims, 8 Drawing Sheets

US 8,729,907 B2

RESISTANCE-CAPACITANCE CALIBRATION CIRCUIT WITHOUT CURRENT MISMATCH AND METHOD THEREOF

BACKGROUND OF THE INVENTION

1. Field of the Invention

The present invention relates to a resistor-capacitance (RC) calibration circuit, and more particularly, to an RC calibration circuit using a single current source.

2. Description of the Prior Art

In integrated-circuitry (IC), poles and zeros of frequency response, current sources and biasing voltages are usually implemented by passive components such as resistors and capacitors. Real values of the passive components, however, will deviate from the designed value due to variations of process, voltage and temperature (PVT). As a result, the poles and zeros of the frequency response are hard to control, meaning currents of current sources and the voltages of biasing points will also deviate from the designed values. Performance of the integrated circuitry is significantly reduced.

For example, when a filter of an integrated circuit is implemented in a resistor and a capacitor, a pole and a zero of the filter are directly related to a resistance R of the resistor and a capacitance C of the capacitor C. The frequency response of the filter is decided by the resistance R and the capacitance C. If the resistance R and the capacitance C—vary with process variation, the frequency band of the filter will deviate from the desired frequency band of the circuit system, such that the overall performance of the integrated circuit is decreased.

To overcome the above problems, a conventional method uses a resistance-capacitance (RC) calibration circuit to correct the deviation of the resistance R and the capacitance C and thereby improve the overall performance of the integrated circuit. The RC calibration circuit uses multiple current sources to generate a plurality of voltages utilized for RC calibration processes. The current of each current source will vary, however, due to process variations, the result being that the plurality of voltages will deviate from their designed values. As a result, current mismatches generated from the process variation decrease the accuracy of the RC calibration circuit and worsen the overall performance of the integrated circuit.

SUMMARY OF THE INVENTION

The present invention discloses an RC calibration circuit with high accuracy. The RC calibration circuit uses a single current to eliminate the non-ideal effect caused by current mismatches.

In an aspect, the present invention discloses a resistor-capacitor (RC) calibration circuit. The RC calibration circuit comprises a current source, for providing a current to a first node; a first switch, coupled between the first node and a second node; a second switch, coupled between the first node and a third node; a resistor, coupled between a reference terminal and the second node; a variable capacitor, coupled between the reference terminal and the third node; a third switch, coupled between the third node, the variable capacitor and the reference terminal; a comparator, comprising a first input coupled to the second node and a second input coupled to the third node; and a logic controller, coupled between an output of the comparator and the variable capacitor for outputting an adjusting signal according to an output signal of the comparator to adjust a capacitance of the variable capacitor.

In another aspect, the present invention discloses a resistor-capacitance (RC) calibration method. The RC calibration method comprises: providing a current to a variable capacitor such that the variable capacitor is charged/discharged for a predetermined time and stopping providing the current to the variable capacitor to substantially keep a voltage of the variable capacitor as a comparison voltage; providing the current to a resistor to generate a reference voltage; comparing the comparison voltage and the reference voltage to generate a comparison result, and adjusting a capacitance of the variable capacitor according to the comparison result; charging/discharging the voltage of the variable capacitor to a voltage of a reference terminal; and repeating the above steps until the comparison voltage substantially equals the reference voltage.

These and other objectives of the present invention will no doubt become obvious to those of ordinary skill in the art after reading the following detailed description of the preferred embodiment that is illustrated in the various figures and drawings.

DETAILED DESCRIPTION

In embodiments of the present invention, an RC calibration circuit using a single current source to generate a comparison voltage and a reference voltage utilized in RC calibration is disclosed. Accordingly, a calibration result outputted by the RC calibration circuit is unrelated to the single current source, such that the problem of calibration deviation due to current mismatch can be avoided. The present invention is particularly shown and described with respect to at least one exemplary embodiment accompanied with drawings. Words utilized for describing connection between two components such as couple and connect should not be taken as limiting a connection between the two components to be directly coupling or indirectly coupling.

Figure 1:
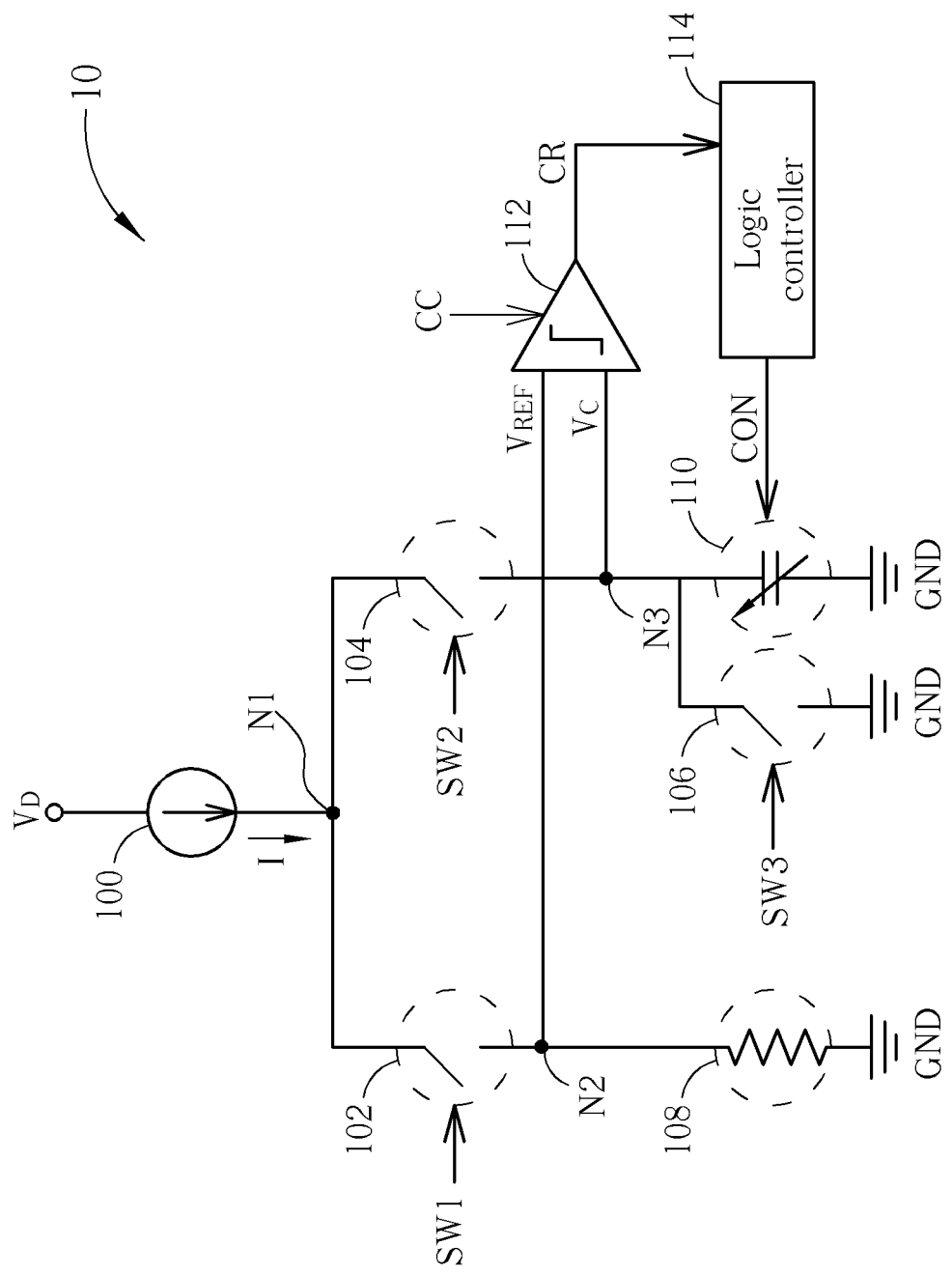
FIG. 1 is a schematic diagram of an RC calibration circuit according to an embodiment of the present invention.

Please refer to FIG. 1, which is a schematic diagram of an RC calibration circuit 10 according to an embodiment of the present invention. As shown in FIG. 1, the RC calibration circuit 10 comprises a current source 100, switches 102, 104, 106, a resistor 108, a variable capacitor 110, a comparator 112 and a logic controller 114. The current source 100 is utilized for providing a current I from a power terminal VD to a node N1. The switch 102 is coupled between the node N1 and a node N2, for controlling a connection between the node N1 and the node N2 according to a switch control signal SW1. Similarly, the switch 104 is coupled between the node N1 and a node N3, for controlling a connection between the node N1 and the node N3 according to a switch control signal SW2. The switch 106 controls a connection between the node N3 and a ground GND according to a switch control signal SW3. The resistor 108 has a resistance $R_{REF}$ and is coupled between a reference terminal (ex. the ground GND) and the node N2 for generating a reference voltage $V_{REF}$ at the node N2. The variable capacitor 110 is coupled between the reference terminal and the node N3, for generating a comparison voltage $V_C$ at the node N3. A capacitance $C_{VAR}$ of the variable capacitor 110 is decided according to an adjusting signal CON and is within a maximum capacitance $C_{MAX}$ and a minimum capacitance $C_{MIN}$. An initial value of the capacitance $C_{VAR}$ may be one of the maximum capacitance $C_{MAX}$ and the minimum capacitance $C_{MIN}$.

The comparator 112 comprises a first input coupled to the node N2, and a second input coupled to the node N3. The comparator 112 is configured for generating a comparison result CR at an output according to the comparison voltage $V_C$ and the reference voltage $V_{REF}$. Preferably, the comparator 112 is a strobed comparator which can periodically or alternatively operate in a comparison mode and a reset mode according to a mode control signal CC. When the comparator 112 operates in the comparison mode, the comparator 112 compares the comparison voltage $V_C$ and the reference voltage $V_{REF}$ and outputs the comparison result CR. When the comparator 112 operates in the reset mode, the comparator 112 does not compare the comparison voltage $V_C$ and the reference voltage $V_{REF}$ and keeps the comparison result CR the same. The logic controller 114 outputs the adjusting signal CON according to the comparison result CR to adjust the capacitance $C_{VAR}$ of the variable capacitor 110.

A main goal of the RC calibration circuit 10 is to generate the reference voltage $V_{REF}$ and the comparison voltage $V_C$ by the same current I through appropriately configuring switching sequences of the switch control signal SW1-SW3. Another goal of the RC calibration circuit 10 comprises timely comparing the reference voltage $V_{REF}$ and the comparison voltage $V_C$ through appropriately configuring switching sequences of the mode control signal CC and accordingly generating the adjusting signal CON according to the comparison result CR to adjust the capacitance $C_{VAR}$ of the variable capacitor 110 until the comparison voltage $V_C$ substantially equals the reference voltage $V_{REF}$. At this moment, the capacitance $C_{VAR}$ is a calibration capacitance. A product of the resistance $R_{REF}$ and the capacitance $C_{VAR}$ is a predetermined value unrelated to the current I, i.e. the product of the resistance $R_{REF}$ and the capacitance $C_{VAR}$ has no non-ideal effect of current mismatch.

The operation procedures of the RC calibration circuit 10 are described as following. At the beginning of a switching period, the mode control signal CC and the switch control signals SW1-SW3 are appropriately set such that the comparator 112 operates in the reset mode, the switch 102 and the switch 106 are disconnected, and the switch 104 is conductive. In such a condition, the variable capacitor 110 is charged by the current I of the current source 100 from ground GND. The switch control signal SW2 is switched after a predetermined time T to disconnect the switch 104 and to keep the voltage of the variable capacitor 110 as the comparison voltage $V_C$. Thus, the comparison voltage $V_C$ can be expressed as:

$$V_C = \frac{I \times T}{C_{VAR}} \quad (1)$$

The switch control signal SW1 is then switched to conduct the switch 102. The current I provided by the current source 100 flows through the resistor 108 to generate the reference voltage $V_{REF}$.

Therefore, the reference voltage $V_{REF}$ can be expressed as:

$$V_{REF} = I \times R_{REF} \quad (2)$$

After the reference voltage $V_{REF}$ is generated and stable, the mode control signal CC is switched to instruct the comparator 112 to operate in the comparison mode and the comparator 112 begins to compare the reference voltage $V_{REF}$ and the comparison voltage $V_C$. In one embodiment, the initial value of the capacitance $C_{VAR}$ is the maximum capacitance $C_{MAX}$, the comparison voltage $V_C$ is smaller than the reference voltage $V_{REF}$ and the comparator 112 outputs the comparison result CR to instruct a lower status. The logic controller 114 lowers the capacitance $C_{VAR}$. Preferably, the logic controller 114 lowers the capacitance $C_{VAR}$ by a specific capacitance $C_{bin}$. After the comparator 112 outputs the comparison result CR, the switch control signal SW3 is switched such that the switch 116 is conductive to discharge the comparison voltage $V_C$ to ground GND. At the same time, the mode control signal CC is switched such that the comparator 112 operates in the reset mode to keeps the comparison result CR.

The RC calibration circuit 10 will repeat the above steps to monotonically lower the capacitance $C_{VAR}$ until the comparison voltage $V_C$ exceeds the reference voltage $V_{REF}$. Noticeably, as long as the variable range of the capacitance $C_{VAR}$ (i.e. the range between the maximum capacitance $C_{MAX}$ and the minimum capacitance $C_{MIN}$) is sufficiently wide and the specific capacitance $C_{bin}$ is sufficiently small, the comparison voltage $V_C$ can approximate the reference voltage $V_{REF}$. The expression (1) and the expression (2) can be combined as:

$$R_{REF} \times C_{VAR} = T \quad (3)$$

As a result, the product of the resistance $R_{REF}$ and the capacitance $C_{VAR}$ equals the predetermined time T. As can be seen from the expression (3), the product of the resistance $R_{REF}$ and the capacitance $C_{VAR}$ is unrelated to the current I.

Figure 2:
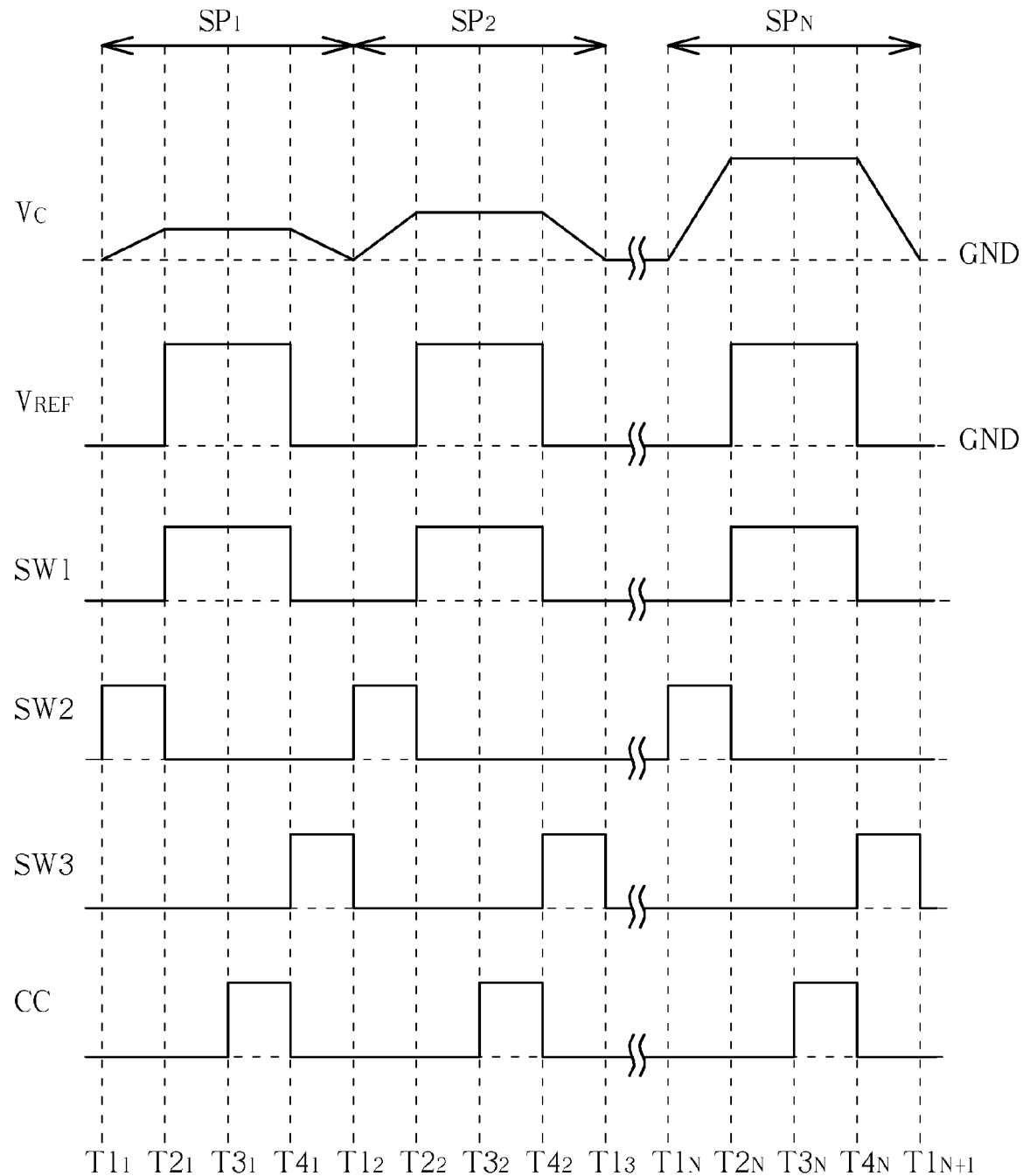
FIG. 2 is a schematic diagram of related signals when the RC calibration circuit shown in FIG. 1 is operating according to an embodiment.

Please refer to FIG. 2, which is a waveform of related signals when the RC calibration circuit 10 shown in FIG. 1 is operating according to an embodiment. In this embodiment, the initial value of the capacitance $C_{VAR}$ is the maximum capacitance $C_{MAX}$. As shown in FIG. 2, a switching period $SP_1$ begins at a time $T1_1$. At this moment, the mode control signal CC instructs the reset mode, the switch control signals SW1, SW3 instruct a disconnection status, and the switch control signal SW2 instructs a conductive status. The comparator 112 operates in the reset mode, the switch 102 and the switch 106 are disconnected, and the switch 104 is conductive. Thus, the comparison voltage $V_C$ linearly increases in a slope I/CVAR. After the predetermined time T, i.e. at a time $T2_1$, the switch control signal SW1 is switched to instruct the conductive status and the switch control signal SW2 is switched to instruct the disconnection status. Thus, the current I is switched to flow through the resistor 108. The voltage of the variable capacitor 110 before the switch 104 is disconnected is kept as the comparison voltage $V_C$, and the reference voltage $V_{REF}$ is the product of the resistance $R_{REF}$ of the resistor 108 and the current I. Then, at a time $T3_1$, the switch control signal SW1 continues instructing the conductive status and the mode control signal CC instructs the comparison mode. The comparator 112 begins to compare the reference voltage $V_{REF}$ and the comparison voltage $V_C$, and outputs the comparison result CR to instruct the lower status. At a time $T4_1$, logic controller 114 lowers the capacitance $C_{VAR}$ the specific capacitance $C_{bin}$ via the adjusting signal CON according to the comparison result CR. Finally, the switch control signal SW1 is switched to disconnect the switch 102 and the switch control signal SW3 is switched to conduct the switch 106, such that the comparison voltage $V_C$ is decreased to ground GND. The mode control signal CC is switched to instruct the reset mode, such that the comparator 112 maintains the comparison result CR.

The above steps are repeatedly executed in switching periods $SP_2$-$SP_N$, wherein the capacitance $C_{VAR}$ is monotonically decreased until the switching period $SP_N$. At a time $T3_N$ of the switching period $SP_N$, the comparison voltage $V_C$ exceeds the reference voltage $V_{REF}$ and the comparison result CR is switched to instruct a higher status. At this moment, the capacitance $C_{VAR}$ is the calibration capacitance and the product of the resistance $R_{REF}$ and the capacitance $C_{VAR}$ is the predetermined time T.

Figure 3:
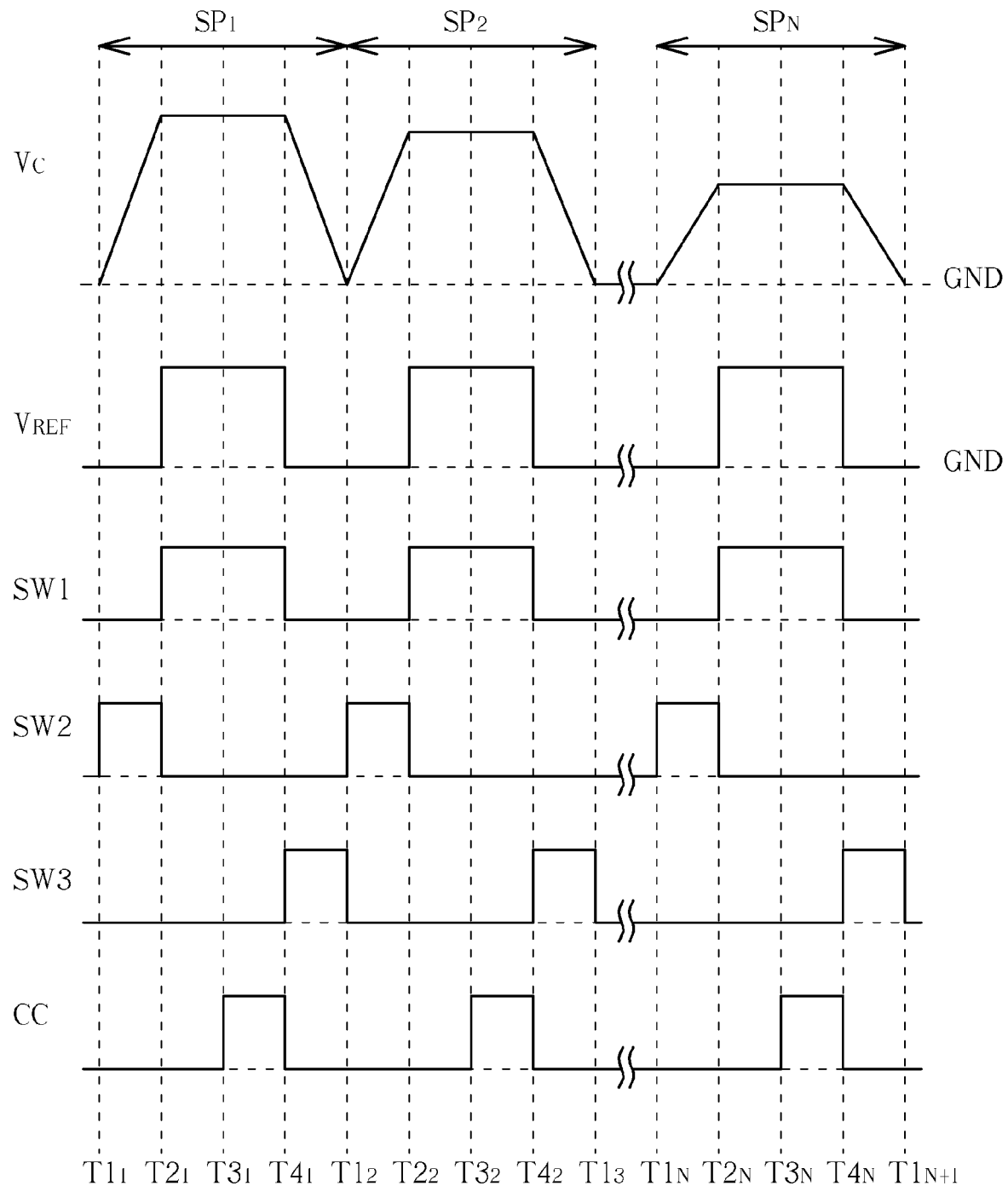
FIG. 3 is a schematic diagram of related signals when the RC calibration circuit shown in FIG. 1 is operating according to another embodiment.

The initial value of the capacitance $C_{VAR}$ of the variable capacitor 110 can be the minimum capacitance $C_{MIN}$. Please refer to FIG. 3, which shows a waveform of related signals when the RC calibration circuit 10 shown in FIG. 1 is operating according to another embodiment. In contrast to FIG. 2, since the initial value of the capacitance $C_{VAR}$ is the minimum capacitance $C_{MIN}$, the comparison voltage $V_C$ is greater than the reference voltage $V_{REF}$ at the time $T3_1$ of the switching period $SP_1$. The comparison result CR instructs the higher status such that the logic controller 114 increases the capacitance $C_{VAR}$. Preferably, the logic controller 114 increases the capacitance $C_{VAR}$ by the specific capacitance $C_{bin}$. Similarly, the capacitance $C_{VAR}$ is monotonically increased until the switching period $SP_N$. At the time $T3_N$ of the switching period $SP_N$, the comparison voltage $V_C$ is lower than the reference voltage $V_{REF}$ and the comparison result CR is switched to instruct the lower status. At this moment, the capacitance $C_{VAR}$ is the calibration capacitance and the product of the resistance $R_{REF}$ and the capacitance $C_{VAR}$ is the predetermined time T.

Figure 4:
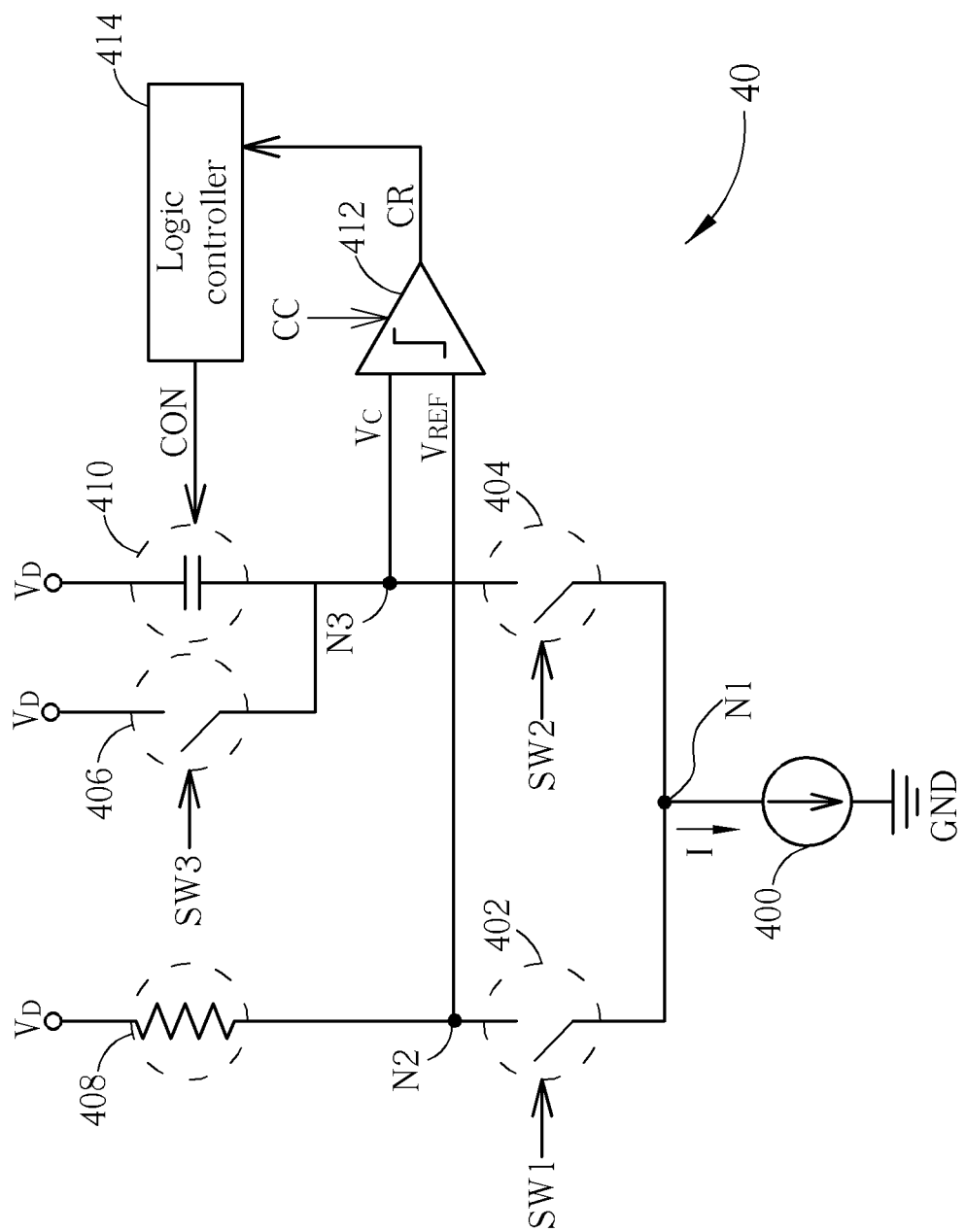
FIG. 4 is a schematic diagram of an RC calibration circuit according to another embodiment of the present invention.

Please reefer to FIG. 4, which is a schematic diagram of a RC calibration circuit 40 according to another embodiment of the present invention. As shown in FIG. 4, the RC calibration circuit 40 comprises a current source 400, switches 402, 404, 406, a resistor 408, a variable capacitor 410, a comparator 413 and a logic controller 414. The structure of the RC calibration circuit 40 is similar to the RC calibration circuit 10 shown in FIG. 1 and the same signals therefore use the same symbols and The difference from the RC calibration circuit 10 shown in FIG. 1 is that the current source 400 of the RC calibration circuit 40 is changed to couple to ground GND. Similarly, the switch 406, the resistor 408, and the variable capacitor 410 are changed to couple to the power terminal VD, wherein the voltage of the power terminal VD is a voltage VDD.

At the beginning of a switching period, the mode control signal CC and the switch control signals SW1-SW3 are appropriately set such that the comparator 412 operates in the reset mode, the switch 402 and the switch 406 are disconnected, and the switch 404 is conductive. The variable capacitor 410 is discharged by the current I of the current source 400 from the voltage VDD. The switch control signal SW2 is switched after the predetermined time T to disconnect the switch 404 and to keep the voltage of the variable capacitor 410 as the comparison voltage $V_C$. Thus, the comparison voltage $V_C$ can be expressed as:

$$V_C = VDD - \frac{I \times T}{C_{VAR}} \quad (4)$$

The switch control signal SW1 is then switched to conduct the switch 402. The current I provided by the current source 400 flows through the resistor 408 to generate the reference voltage $V_{REF}$. Therefore, the reference voltage $V_{REF}$ can be expressed as:

$$V_{REF} = VDD - I \times R_{REF} \quad (5)$$

After the reference voltage $V_{REF}$ is generated and stable, the mode control signal CC is switched to instruct the comparator 412 to operate in the comparison mode and the comparator 412 begins to compare the reference voltage $V_{REF}$ and the comparison voltage $V_C$. In one embodiment, the initial value of the capacitance $C_{VAR}$ is the maximum capacitance $C_{MAX}$, the comparison voltage $V_C$ is greater than the reference voltage $V_{REF}$ and the comparator 412 outputs the comparison result CR to instruct the higher status. The logic controller 414 lowers the capacitance $C_{VAR}$. Preferably, the logic controller 414 lowers the capacitance $C_{VAR}$ by the specific capacitance $C_{bin}$. After the comparator 412 outputs the comparison result CR, the switch control signal SW3 is switched such that the switch 416 is conductive to charge the comparison voltage $V_C$ to the voltage VDD. At the same time, the mode control signal CC is switched such that the comparator 412 operates in the reset mode to keep the comparison result CR.

The RC calibration circuit 40 will repeat the above steps to monotonically decrease the capacitance $C_{VAR}$ until the comparison voltage $V_C$ is lower than the reference voltage $V_{REF}$. Noticeably, as long as the variable range of the capacitance $C_{VAR}$ (i.e. the range between the maximum capacitance $C_{MAX}$ and the minimum capacitance $C_{MIN}$) is sufficiently wide and the specific capacitance $C_{bin}$ is sufficiently small, the comparison voltage $V_C$ can approximate the reference voltage $V_{REF}$. The expression (4) and the expression (5) can be combined as:

$$R_{REF} \times C_{VAR} = T \quad (6)$$

As a result, the product of the resistance $R_{REF}$ and the capacitance $C_{VAR}$ equals the predetermined time T, i.e. the product of the resistance $R_{REF}$ and the capacitance $C_{VAR}$ is unrelated to the current I.

Figure 5:
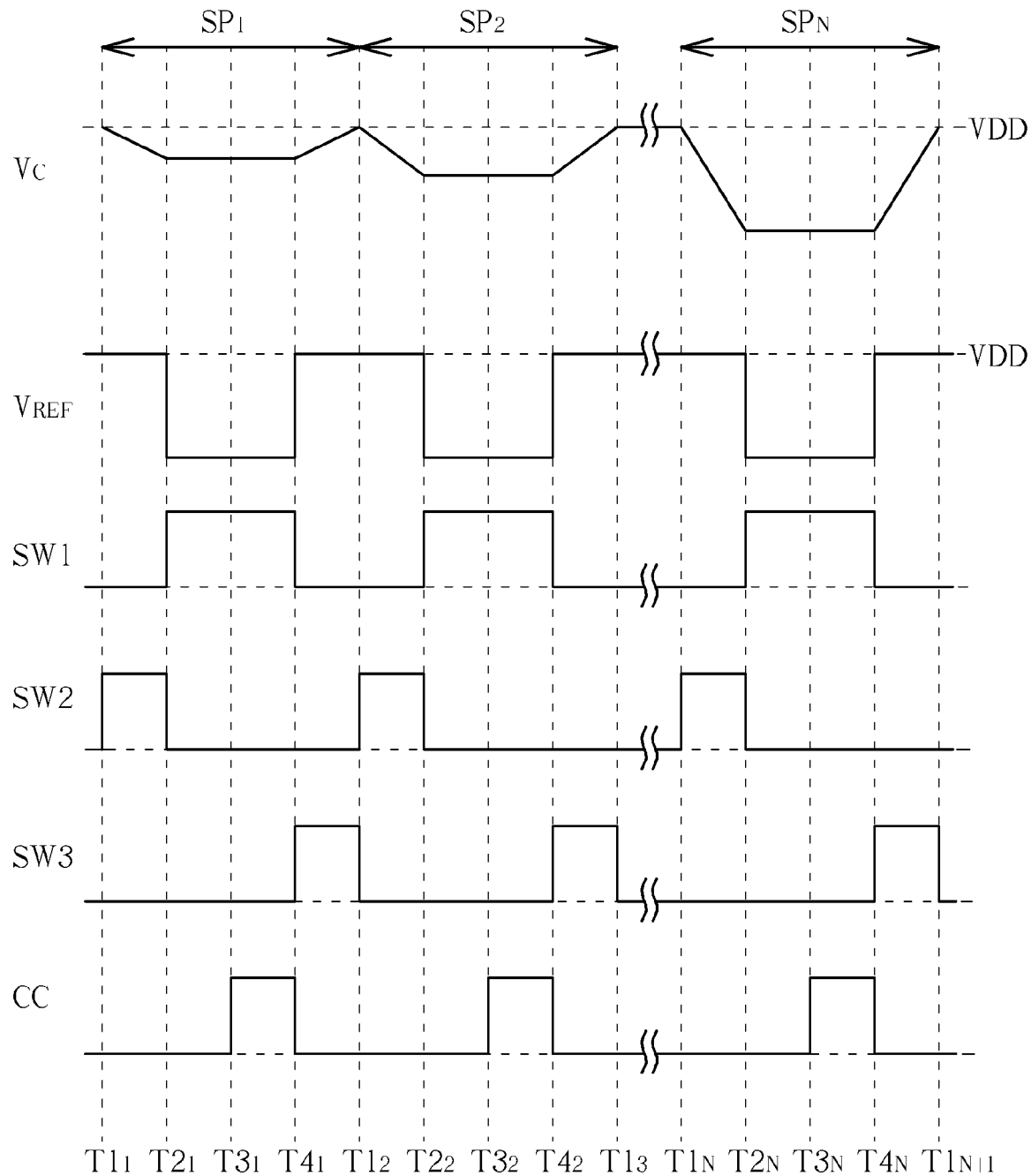
FIG. 5 is a schematic diagram of related signals when the RC calibration circuit shown in FIG. 4 is operating according to an embodiment.

Please refer to FIG. 5, which illustrates a waveform of related signals when the RC calibration circuit 40 shown in FIG. 4 is operating according to an embodiment. In this embodiment, the initial value of the capacitance $C_{VAR}$ is the maximum capacitance $C_{MAX}$. As shown in FIG. 5, a switching period $SP_1$ begins at a time $T1_1$. At this moment, the mode control signal CC instructs the reset mode, the switch control signal SW1 and the switch control signal SW3 instruct the disconnection status, and the switch control signal SW2 instructs the conductive status. The comparator 412 operates in the reset mode, the switch 402 and the switch 406 are disconnected, and the switch 404 is conductive. Thus, the comparison voltage $V_C$ linearly decreases in a slope (–I/CVAR). After the predetermined time T, i.e. at a time $T2_1$, the switch control signal SW1 is switched to instruct the conductive status and the switch control signal SW2 is switched to instruct disconnection status. The current I is switched to flow through the resistor 408. The voltage of the variable capacitor 410 before the switch 404 is disconnected is kept as the comparison voltage $V_C$, and the reference voltage $V_{REF}$ is the product of the resistance $R_{REF}$ of the resistor 408 and the current I. Then, at a time $T3_1$, the switch control signal SW1 continues to instruct the conductive status and the mode control signal CC instructs the comparison mode. The comparator 412 begins to compare the reference voltage $V_{REF}$ and the comparison voltage $V_C$, and outputs the comparison result CR to instruct the higher status. At a time T41, logic controller 414 decreases the capacitance $C_{VAR}$ the specific capacitance $C_{bin}$ via the adjusting signal CON according to the comparison result CR. Finally, the switch control signal SW1 is switched to disconnect the switch 402 and the switch control signal SW3 is switched to conduct the switch 406, such that the comparison voltage $V_C$ is charged to the voltage VDD. The mode control signal CC is switched to instruct the reset mode, such that the comparator 412 maintains the comparison result CR.

The steps mentioned above are repeatedly executed in switching periods $SP_2$-$SP_N$, wherein the capacitance $C_{VAR}$ is monotonically decreased until the switching period $SP_N$. At a time $T3_N$ of the switching period SPN, the comparison voltage $V_C$ is lower than the reference voltage $V_{REF}$ and the comparison result CR is switched to instruct the lower status. At this moment, the capacitance CVAR is the calibration capacitance and the product of the resistance $R_{REF}$ and the capacitance $C_{VAR}$ is the predetermined time T.

Figure 6:
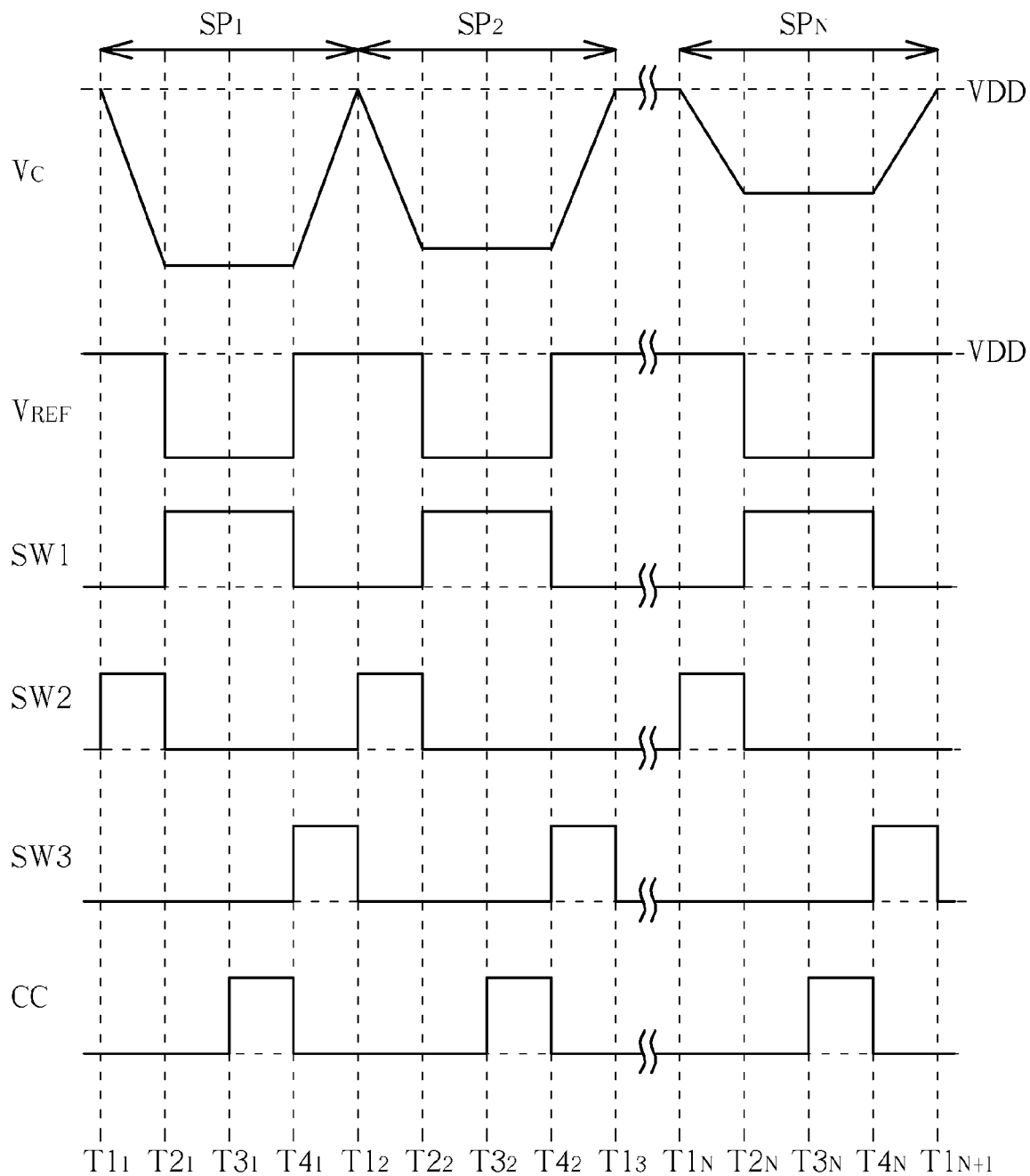
FIG. 6 is a schematic diagram of related signals when the RC calibration circuit shown in FIG. 4 is operating according to another embodiment.

The initial value of the capacitance $C_{VAR}$ of the variable capacitor 410 can be the minimum capacitance $C_{MIN}$. Please refer to FIG. 6, which illustrates another waveform of related signals when the RC calibration circuit 40 shown in FIG. 4 is operating according to another embodiment. In contrast with FIG. 5, since the initial value of the capacitance $C_{VAR}$ is the minimum capacitance $C_{MIN}$, the comparison voltage $V_C$ is smaller than the reference voltage $V_{REF}$ at the time $T3_1$ of the switching period $SP_1$. Thus, the comparison result CR instructs the lower status such that the logic controller 414 increases the capacitance $C_{VAR}$. Preferably, the logic controller 114 increases the capacitance $C_{VAR}$ by the specific capacitance $C_{bin}$. Similarly, the capacitance $C_{VAR}$ is monotonically increased until the switching period $SP_N$. At the time $T3_N$ of the switching period $SP_N$, the comparison voltage $V_C$ exceeds the reference voltage $V_{REF}$ and the comparison result CR is switched to instruct the higher status. At this moment, the capacitance $C_{VAR}$ is the calibration capacitance and the product of the resistance $R_{REF}$ and the capacitance $C_{VAR}$ is the predetermined time T.

Figure 7:
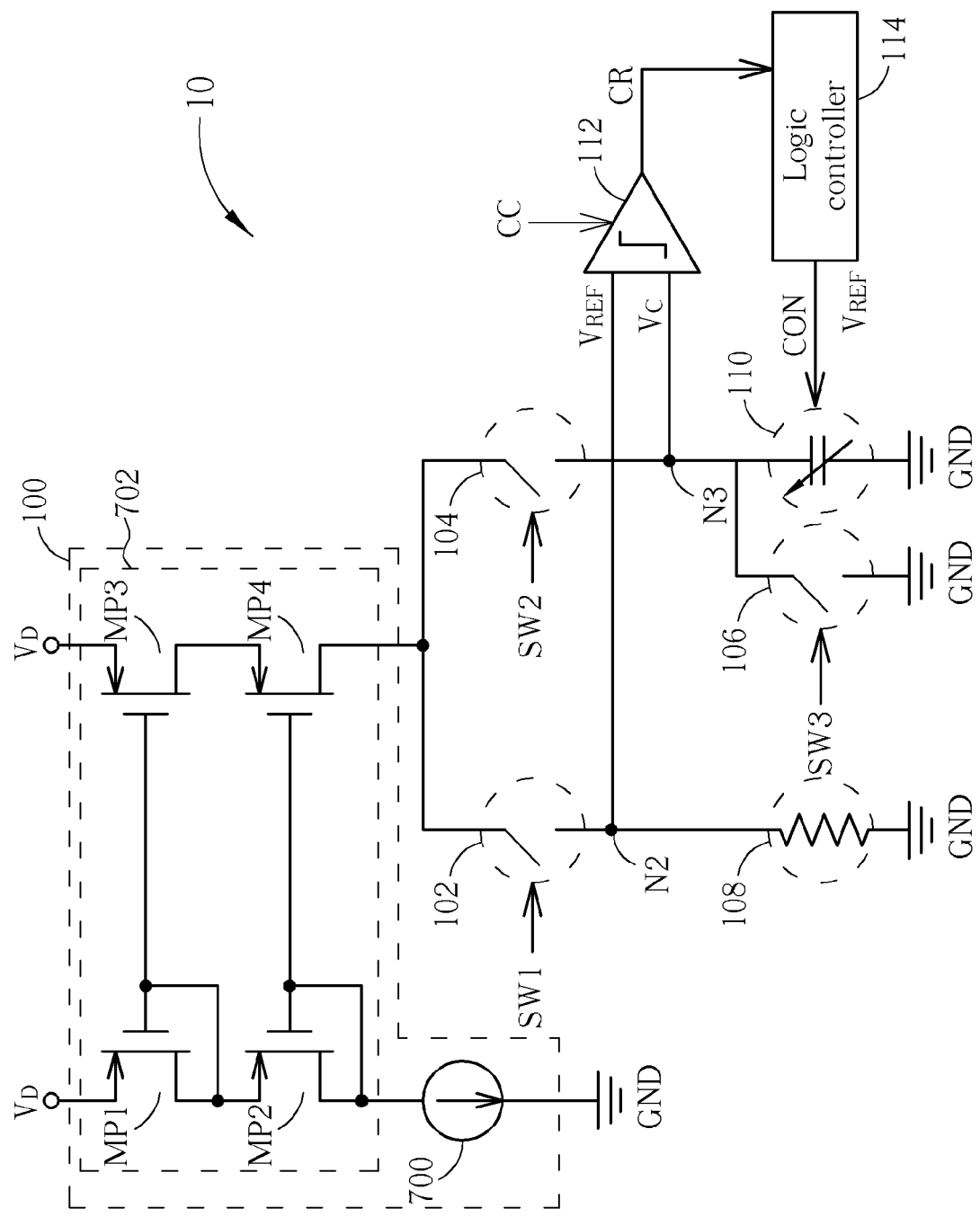
FIG. 7 is a schematic diagram of another implementation method of the RC calibration circuit shown in FIG. 1.

Noticeably, the spirit of the above embodiments is to use a single current source to generate the comparison voltage and the reference voltage utilized in RC calibration, such that a calibration result of the RC calibration circuit is unrelated to the single current source; i.e. the calibration result of the RC calibration circuit is not biased by current mismatch. Those skilled in the art can accordingly make appropriate modifications and adjustments according to different applications. For example, the current source utilized for generating the comparison voltage $V_C$ and the reference voltage $V_{REF}$ can be implemented in various methods. Please refer to FIG. 7, which is a schematic diagram of another implementation method of the RC calibration circuit 10 shown in FIG. 1. As shown in FIG. 7, the current source 100 is implemented in a current source 700 and a cascode current mirror 702, wherein the cascode current mirror 702 consists of transistors MP1-MP4. Operation principles of the current source 700 and the cascode current mirror 702 are well known to those skilled in the art, and are not described herein for brevity.

Figure 8:
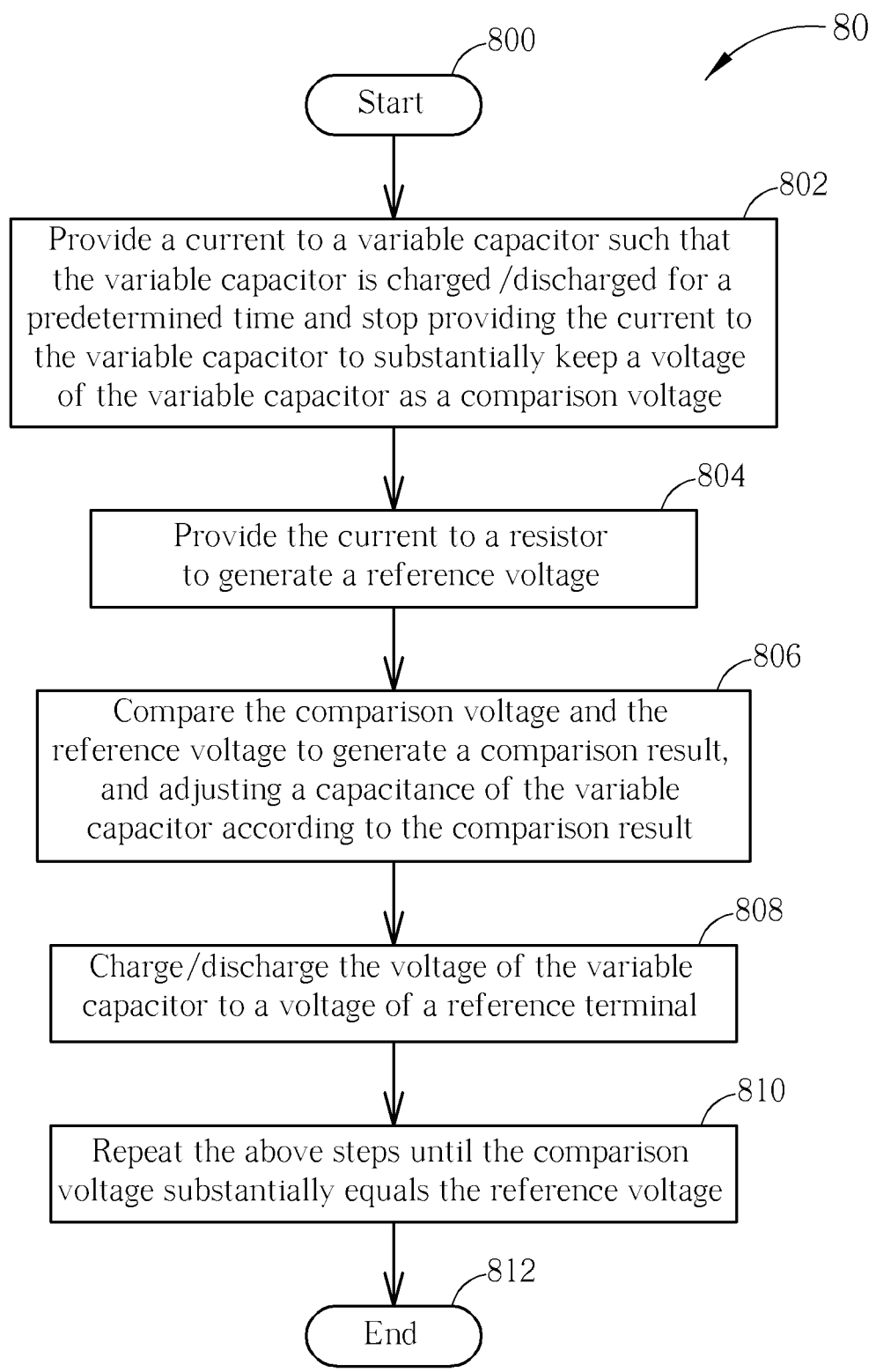
FIG. 8 is a schematic diagram of an RC calibration method according to an embodiment of the present invention.

An RC calibration method 80 can be summarized from the above steps. Please refer to FIG. 8, which is a schematic diagram of the RC calibration method 80. The RC calibration method 80 comprises:

Step 800: Start.

Step 802: Provide a current to a variable capacitor such that the variable capacitor is charged/discharged for a predetermined time and stop providing the current to the variable capacitor to substantially keep a voltage of the variable capacitor as a comparison voltage;

Step 804: Provide the current to a resistor to generate a reference voltage;

Step 806: Compare the comparison voltage and the reference voltage to generate a comparison result, and adjusting a capacitance of the variable capacitor according to the comparison result;

Step 808: Charge/discharge the voltage of the variable capacitor to a voltage of a reference terminal;

Step 810: Repeat the above steps until the comparison voltage substantially equals the reference voltage;

Step 812: End.

After finishing the RC calibration method 80, a product of a resistance of the resistor and the capacitance of the variable capacitor substantially equals the predetermined time. In other words, through the RC calibration method 80, the RC calibration result is unrelated to the current. Note that, in the step 806, the method of adjusting the capacitance of the variable capacitor can be appropriately modified according to different applications. For example, the capacitance of the variable capacitor can be increased from a minimum capacitance or decreased from a maximum capacitance.

To sum up, the RC calibration circuitry disclosed by the above embodiments use a single current source to generate the comparison voltage and the reference voltage utilized in RC calibration. Accordingly, the RC calibration result outputted by the RC calibration circuitry can be unrelated to the current source, which means the RC calibration result outputted by the RC calibration circuitry can avoid being biased by current mismatch. Therefore, the RC calibration circuitry disclosed by the above embodiments can effectively increase accuracy of the RC calibration result.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistor-capacitor (RC) calibration circuit, comprising:
   a current source, for providing a current to a first node;
   a first switch, coupled between the first node and a second node;
   a second switch, coupled between the first node and a third node;
   a resistor, coupled between a reference terminal and the second node;
   a variable capacitor, coupled between the reference terminal and the third node;
   a third switch, coupled between the third node and the reference terminal;
   a comparator, comprising a first input coupled to the second node and a second input coupled to the third node; and
   a logic controller, coupled between an output of the comparator and the variable capacitor for outputting an adjusting signal according to an output signal of the comparator to adjust a capacitance of the variable capacitor.

2. The RC calibration circuit of claim 1, wherein the comparator is a strobed comparator.

3. The RC calibration circuit of claim 1, wherein the comparator periodically operates in a comparison mode or a reset mode according to a switching period.

4. The RC calibration circuit of claim 3, wherein the logic controller monotonically adjusts the capacitance of the variable capacitor according to the output signal when the comparator operates in the comparison mode in each switching period.

5. The RC calibration circuit of claim 4, wherein the logic controller monotonically adjusts the capacitance of the variable capacitor by a fixed capacitance when a voltage of the output signal at the first input does not equal a voltage of the second input.

6. The RC calibration circuit of claim 4, wherein the logic controller monotonically adjusts the capacitance of the variable capacitor until a voltage of the first input substantially equals a voltage of the second input in at least one switching period.

7. The RC calibration circuit of claim 3, wherein the first switch, the second switch and the third switch are respectively conductive or disconnected according to the switching period.

8. The RC calibration circuit of claim 7, wherein a switching sequence of the first switch, the second switch and the third switch is configured to first feed the current to the variable capacitor to generate a comparison voltage at the third node and then feed the current to the resistor to generate a reference voltage in each switching period such that the comparator generates the output signal according to the reference voltage and the comparison voltage.

9. The RC calibration circuit of claim 8, wherein the switching sequence of the first switch, the second switch and the third switch is configured to charge/discharge a voltage of the variable capacitor to a voltage of the reference terminal after the comparator generates the output signal in each switching period.

10. The RC calibration circuit of claim 1, wherein the first switch, the second switch and the third switch are conductive or disconnected according to a switching period which comprises a first period, and the first switch and the third switch are disconnected and the second switch is conductive during the first period.

11. The RC calibration circuit of claim 10, wherein the comparator operates in a reset mode and does not compare a voltage of the first input and a voltage of the second input.

12. The RC calibration circuit of claim 10, wherein the switching period further comprises a second period after the first period, and the first switch is conductive and the second switch and the third switch are disconnected during the second period.

13. The RC calibration circuit of claim 12, wherein the comparator operates in a comparison mode and compares a voltage of the first input and a voltage of the second input during a certain time of the second period, and operates in the reset mode and does not compare the voltage of the first input and the voltage of the second voltage during the rest of the second period.

14. The RC calibration circuit of claim 12, wherein the switching period further comprises a third period after the second period and the third switch is conductive and the first switch and the second switch are disconnected during the third period.

15. The RC calibration circuit of claim 14, wherein the comparator operates in the reset mode and does not compare the voltage of the first input and the voltage of the second input during the third period.

16. The RC calibration circuit of claim 1, wherein the comparator generates the output signal according to a comparison voltage of the third node and a reference voltage of the second node.

17. The RC calibration circuit of claim 16, wherein the current of the current source flows through the resistor to generate the reference voltage at the second node when the first switch is conductive.

18. The RC calibration circuit of claim 16, wherein the current of the current source charges/discharges the variable capacitor to generate the comparison voltage at the third node when the second switch is conductive.

19. The RC calibration circuit of claim 18, wherein the second switch is disconnected after being conductive for a predetermined time to substantially keep a voltage of the third node as the comparison voltage.

20. The RC calibration circuit of claim 19, wherein the third switch is conductive after the second switch is disconnected to charge/discharge the voltage of the third node to a voltage of the reference terminal.

21. The RC calibration circuit of claim 1, wherein the capacitance of the variable capacitor is a calibration capacitance when a voltage of the first input equals a voltage of the second input, and a product of the calibration capacitance and the resistance of the resistor substantially equals a predetermined time for which the second switch is conductive.

22. A resistor-capacitance (RC) calibration method, comprising:
providing a current to a variable capacitor such that the variable capacitor is charged/discharged for a predetermined time and stopping providing the current to the variable capacitor to substantially keep a voltage of the variable capacitor as a comparison voltage;
providing the current to a resistor to generate a reference voltage;
comparing the comparison voltage and the reference voltage to generate a comparison result, and adjusting a capacitance of the variable capacitor according to the comparison result;
charging/discharging the voltage of the variable capacitor to a voltage of a reference terminal; and
repeating the above steps until the comparison voltage substantially equals the reference voltage.

23. The RC calibration method of claim 22, wherein the step of adjusting a capacitance of the variable capacitor according to the comparison result comprises:
monotonically increasing the capacitance of the variable capacitor from a minimum capacitance.

24. The RC calibration method of claim 22, wherein the step of adjusting a capacitance of the variable capacitor according to the comparison result comprises:
monotonically decreasing the capacitance of the variable capacitor from a maximum capacitance.

25. The RC calibration method of claim 22, wherein the capacitance of the variable capacitor is a calibration capacitance when the comparison voltage substantially equals the reference voltage and a product of the calibration capacitance and a resistance of the resistor substantially equals the predetermined time.

* * * * *